(12) United States Patent
Rolston et al.

(10) Patent No.: US 8,354,595 B2
(45) Date of Patent: Jan. 15, 2013

(54) ADHESIVE REINFORCED OPEN HOLE INTERCONNECT

(75) Inventors: Kevin C. Rolston, Westchester, CA (US); Alberto F. Viscarra, Torrance, CA (US); Derek Pruden, Redondo Beach, CA (US); Cindy W. Ma, Lawndale, CA (US)

(73) Assignee: Raytheon Company, Waltham, MA (US)

( * ) Notice: Subject to any disclaimer, the term of this patent is extended or adjusted under 35 U.S.C. 154(b) by 121 days.

(21) Appl. No.: 12/764,854

(22) Filed: Apr. 21, 2010

(65) Prior Publication Data

US 2011/0261539 A1    Oct. 27, 2011

(51) Int. Cl.
 *H05K 1/00* (2006.01)
(52) U.S. Cl. ........................................ 174/254; 174/262
(58) Field of Classification Search ................... None
See application file for complete search history.

(56) References Cited

U.S. PATENT DOCUMENTS

| | | | |
|---|---|---|---|
| 5,274,912 A | | 1/1994 | Olenick et al. |
| 5,920,123 A | * | 7/1999 | Moden ........................... 257/774 |
| 6,026,564 A | * | 2/2000 | Wang et al. ...................... 29/830 |
| 6,187,652 B1 | * | 2/2001 | Chou et al. ..................... 438/455 |
| 6,831,236 B2 | * | 12/2004 | Higuchi et al. ................ 174/264 |
| 7,304,247 B2 | * | 12/2007 | Birgel et al. ................... 174/260 |
| 7,525,498 B2 | | 4/2009 | Quan et al. |
| 2002/0009578 A1 | | 1/2002 | Watanabe et al. |
| 2006/0272850 A1 | * | 12/2006 | Morimoto et al. ............. 174/254 |
| 2009/0242253 A1 | * | 10/2009 | Muro et al. .................... 174/260 |

OTHER PUBLICATIONS

Extended European Search Report for European Application No. 11152541.6, Applicant Raytheon Company, European Search Report dated Jun. 16, 2011 and mailed Jun. 27, 2011 (7 pgs.).

* cited by examiner

*Primary Examiner* — Ishwarbhai Patel
(74) *Attorney, Agent, or Firm* — Christie, Parker & Hale, LLP

(57) ABSTRACT

A method for interconnecting a first flex printed circuit board (PCB) with a second flex PCB. The method includes: providing the first flex PCB with holes at contact locations to be electrically coupled to the second flex PCB; providing the second flex PCB with electrical pads corresponding to the holes at the contact locations; applying a non-conductive material between the first PCB and the and second PCB with clearances for each of the electrical pads; aligning the first PCB with the second PCB so that the holes in the first PCB are in line with the corresponding electrical pads on the second PCB; bonding a portion of flat areas on the first and second PCBs together; dispensing a conductive adhesive into the holes to fill the space created by the holes, corresponding clearances of the non-conductive material, and the corresponding electrical pads; and curing the conductive adhesive.

8 Claims, 5 Drawing Sheets

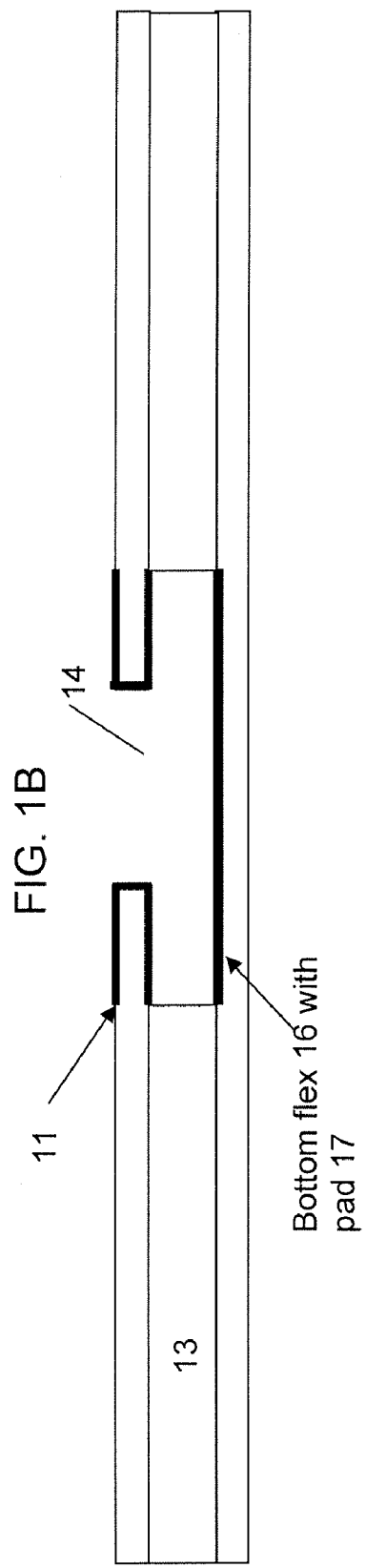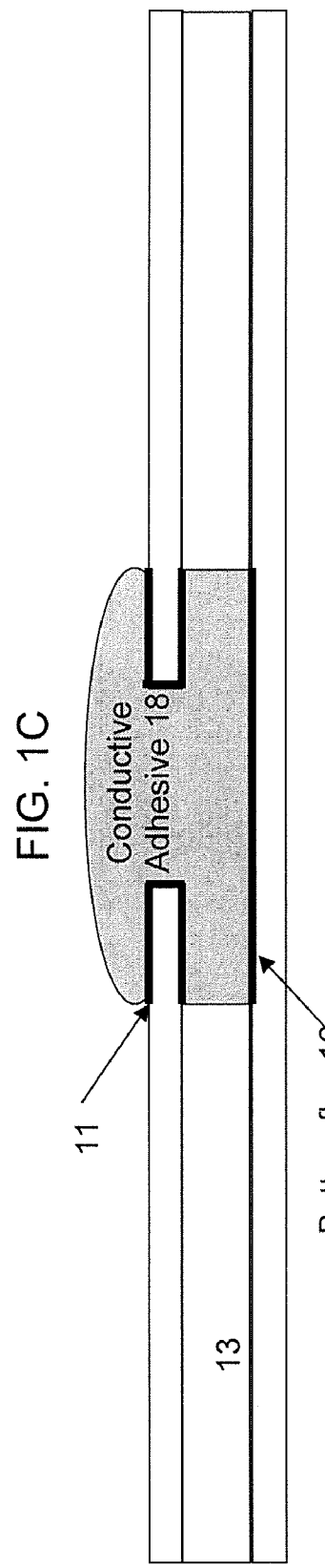

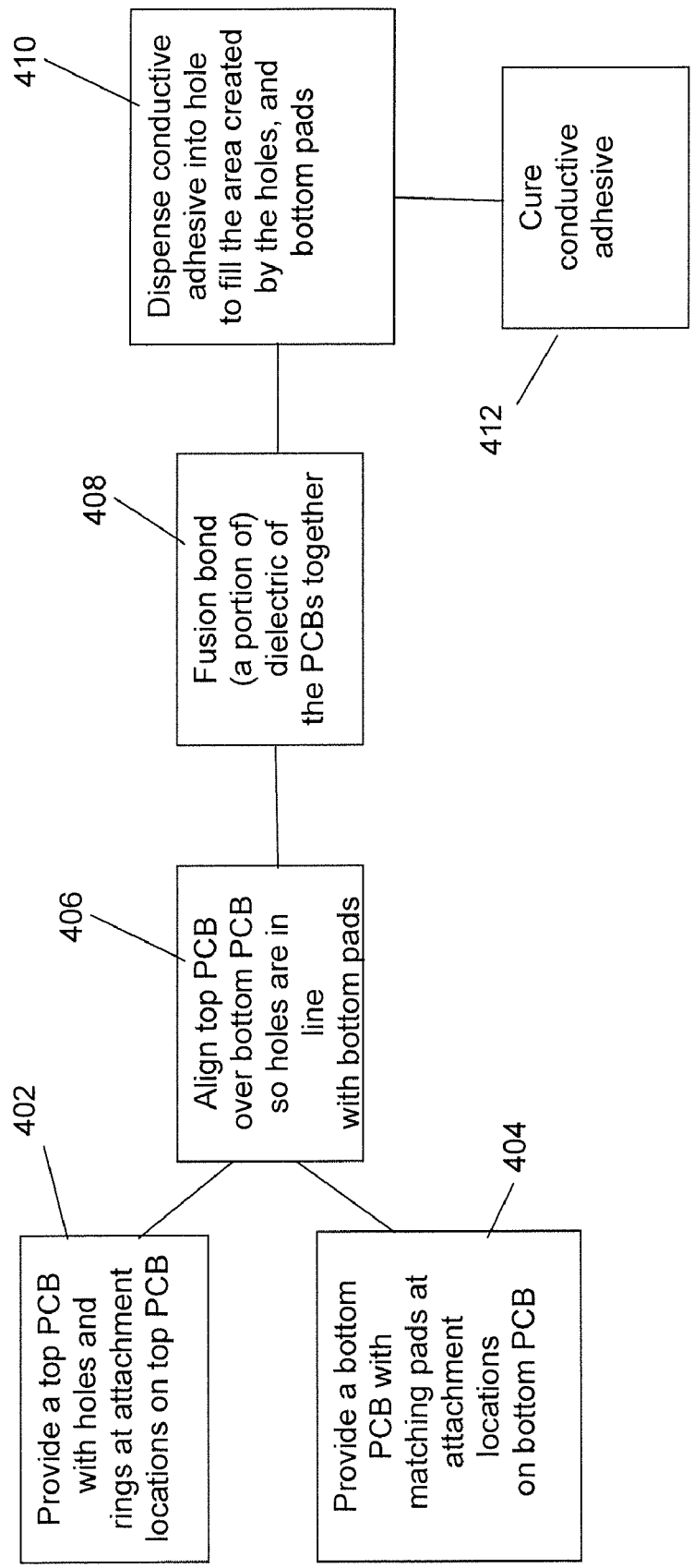

ADHESIVE REINFORCED OPEN HOLE INTERCONNECT

STATEMENT REGARDING FEDERALLY SPONSORED RESEARCH

This invention disclosure is related to Government contact number FA8750-06-C-0048 awarded by the U.S. Air Force. The U.S. Government has certain rights to this invention.

FIELD OF THE INVENTION

The present invention relates generally to flexible printed circuit board (PCB) assemblies and more specifically to an adhesive reinforced open hole interconnect of flexible PCBs.

BACKGROUND

Next generation large area multifunction mixed signal printed circuit board (PCB) assembly for space and airship applications, such as, radar and communication systems need to be lighter weight and more conformal than what can be achieved with current multilayer rigid and flexible (flex) PCB assembly technology. Methods have been created and demonstrated that create antenna structures out of individual layers of flex PCBs that require electrical interconnect between one another. However, many interconnects need to align and bond to form the working circuits. Furthermore, traditional methods of electrically bonding individual layers of flex PCBs have problems with alignment of the electrical pads that require connection.

In more recent attempts, these connections were created with a blind bond attached between pads on the two flex PCBs with dispensed conductive and non-conductive pastes. Nevertheless, in many instances, pads do not align or conductive adhesive short between adjacent pads. Moreover, issues with the quality of the bonds are not known until after the parts are cured and tested. Accordingly, extensive and expensive rework is required if the alignment is off.

Therefore, there is a need for a more accurate and higher quality interconnect of flexible PCBs, specially in Radio Frequency (RF) range.

SUMMARY

In some embodiments, the present invention is a method for interconnecting a first flex PCB with a second flex PCB. The method includes: providing the first flex PCB with holes at contact locations to be electrically coupled to the second flex PCB; providing the second flex PCB with electrical pads corresponding to the holes at the contact locations; applying a non-conductive material between the first PCB and the and second PCB with clearances for each of the electrical pads; aligning the first PCB with the second PCB so that the holes in the first PCB are in line with the corresponding electrical pads on the second PCB; bonding a portion of flat areas on the first and second PCBs together; dispensing a conductive adhesive into the holes to fill the space created by the holes, corresponding clearances of the non-conductive material, and the corresponding electrical pads; and curing the conductive adhesive.

The non-conductive material may be a non-conductive adhesive film and the clearances of the non-conductive material may be cut holes in the adhesive film at the contact locations. The non-conductive material may be a non-conductive paste and the clearances of the non-conductive material may exclude the non-conductive paste at the contact locations.

In some embodiments, the present invention is a method for interconnecting a first flex PCB with a second flex PCB. The method includes: providing the first flex PCB with holes at contact locations to be electrically coupled to the second flex PCB; providing the second flex PCB with electrical pads corresponding to the holes at the contact locations; aligning the first PCB with the second PCB so that the holes in the first PCB are in line with the corresponding electrical pads on the second PCB; mechanically attaching the first PCB to the second PCB by fusion bonding a portion of areas of bare dielectric material on each of the first and second PCB; dispensing a conductive adhesive into the holes to fill the area created by the holes and the corresponding electrical pads; and curing the conductive adhesive.

In some embodiments, the present invention is a flex PCB assembly which includes: a first flex PCB including holes at electrical contact locations; a second flex PCB including electrical pads corresponding to the holes at the electrical contact locations; a non-conductive material between the first PCB and the and second PCB with clearances for each of the electrical pads; and a conductive adhesive dispensed in the holes to fill the space created by the holes, corresponding clearances of the non-conductive material, and the corresponding electrical pads to provide electrical contacts between the hole of the first PCB and the pads of the second PCB, wherein the first PCB is aligned with the second PCB so that the holes in the first PCB are in line with the corresponding electrical pads on the second PCB.

The first flex PCB may also include conductive material at the holes with an annular ring shape. Also, the size of the pads may be larger than the size of the holes.

BRIEF DESCRIPTION OF THE DRAWINGS

FIGS. 1A to 1C show a stack up of two open hole PCBs, according to some embodiments of the present invention.

FIG. 4 shows an exemplary process flow for interconnection of two or more PCBs with fusion bond, according to some embodiments of the present invention.

DETAILED DESCRIPTION

In some embodiments, the present invention is a method for interconnect of flexible PCBs using adhesive reinforced open holes and/or a PCB assembly using the same method. The method of the present invention facilitates bonding of two or more separate flex PCBs that only need to attach in discrete areas to make electrical connection. If these were conventional flat circuits, standard drill and plate techniques could be used. However, since these PCBs (circuits) are only bonded in discrete areas, new processes are incorporated to allow for alignment inspection and post bonding electrical connection.

Figure 1A:
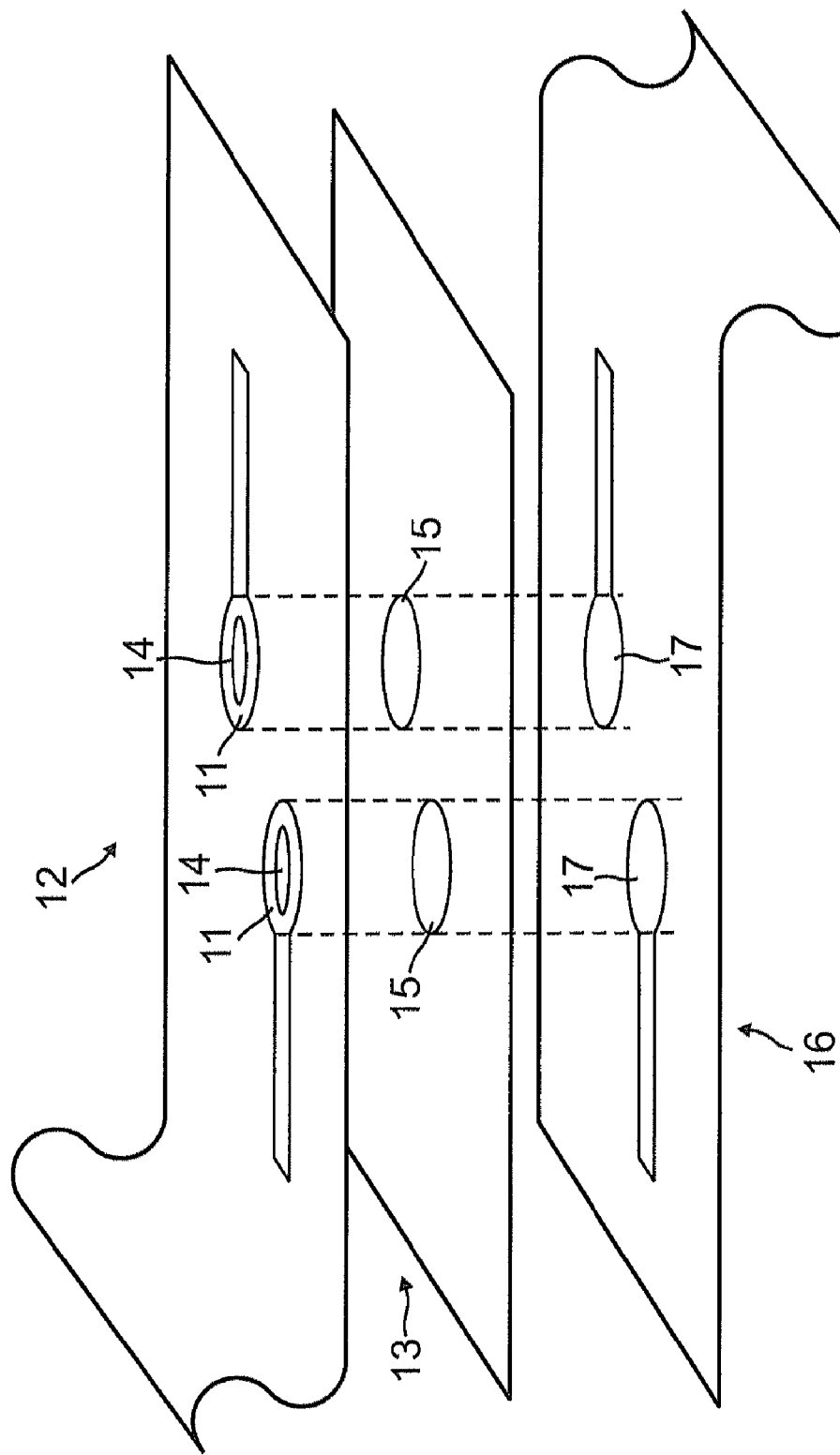

FIGS. 1A to 1C show a stack up of two open hole PCBs, according to some embodiments of the present invention. Although, two PCBs are used for simplicity in the examples through out this disclosure, the present invention is not limited to two PCBs and is also applicable to more than two flexible PCBs to be interconnected. As shown in FIG. 1A, a top flex PCB 12 includes at least one open hole (through hole) 14 with an annular ring 11 on both sides of the PCB anywhere an electrical contact is required. A bottom 3-D flex PCB 16 includes at least one electrical pad 17 that corresponds to the at least one through hole 14, at each location. The electrical pad(s) 17 has the same or slightly larger diameter as the through holes 14 including the annular ring 11. The through hole 14 in the top PCB 12 is used for visual alignment of the top PCB with the bottom PCB 16, and for electrical connection of the two PCBs 12 and 16.

The two PCBs 12 and 16 are bonded together using, for example, a non-conductive adhesive 13, which includes a cutout pad 15, to create mechanical support with clearances around the electrical connection pads 17. In some embodiments, the non-conductive adhesive may be cured to strengthen the boding. After the non-conductive adhesive 13 is applied (or prior to a fusion bond), the top PCB 12 is aligned with the bottom PCB 16 with appropriate tooling. Once in the alignment tooling, alignment is assured by inspecting to see if the holes 14 in the top PCB 12 align with the pads 17 on the bottom PCB 16. Once verified, the non-conductive bond may be cured, for example, by heat, pressure and time. The bond provides a seal around the pads preventing conductive adhesive from squeezing in between layers, which could cause electrical shorts.

FIG. 1B shows the two PCBs 12 and 16 assembled together. Once the non-conductive adhesive 13 is cured (or a fusion bond is completed), a conductive bond, for example, a conductive paste, is dispensed into the hole 14 of the top PCB 12 to the electrical pad 17 below on the bottom PCB 16, and onto the annular ring 11 on the top PCB 12 to make the electrical connection, as shown in FIG. 1C. In some embodiments, the conductive paste is dispensed to fill the cavity created by the hole 14, non-conductive adhesive 13 and pad 17 (FIG. 1B) by syringe or dispense jetting techniques that can get in between the 3-dimensional cavities between the two PCBs.

In some embodiments, the top PCB 12 and the bottom PCB 16 are mechanically bonded together by any of the following methods. A non-conductive film may be placed onto the bottom PCB 16 with clearances around the electrical bonding pads 17 (FIG. 2); a non-conductive paste adhesive may be dispensed onto the bottom PCB 16 with clearances around the electrical bonding pads 17 (FIG. 3); or base dielectric layers (e.g., flex circuit plastic) are fusion bonded together around the pads 17 (FIG. 4). At this point, conductive adhesive is dispensed into the holes of the top circuit to fill the cavity created by the hole, non-conductive adhesive and pad on bottom (FIG. 1c) by syringe or dispense jetting techniques that can get in between the 3-dimensional features of the circuit. Enough conductive adhesive is dispensed to fill the cavity and squeeze up onto the annular ring. The conductive adhesive is then cured to complete the electrical connections.

In some embodiments, standard techniques (circuit etching, drilling and plating) are used to fabricate the circuits (PCBs) separately, however, the open hole of the top PCB may be larger than a standard via, which allows for visual inspection of the alignment with the bottom PCB and subsequent dispensing of conductive adhesive to make the electrical connections. Here, the non-conductive bond used for the mechanical attachment of the two PCBs also provides a seal around the pads for electrical connection that prevents the conductive material from squeezing between circuits, which could cause electrical short circuits.

In some embodiments, the design of the individual PCBs is made such that the top PCB 12 contains large diameter plated through holes 14 with an annular ring of at least 0.002" on top (e.g., in FIG. 1A). The hole 14 is large enough to dispense conductive adhesive through. The catch electrical pad 17 on the bottom PCB 16 is made to be the same or larger diameter of the outer diameter of the annular ring 11. In RF applications, the 2 diameters will most likely be substantially the same, depending on what is required for impedance matching of the system. For non-RF pads, the bottom pad could be larger to improve registration.

Figure 2:
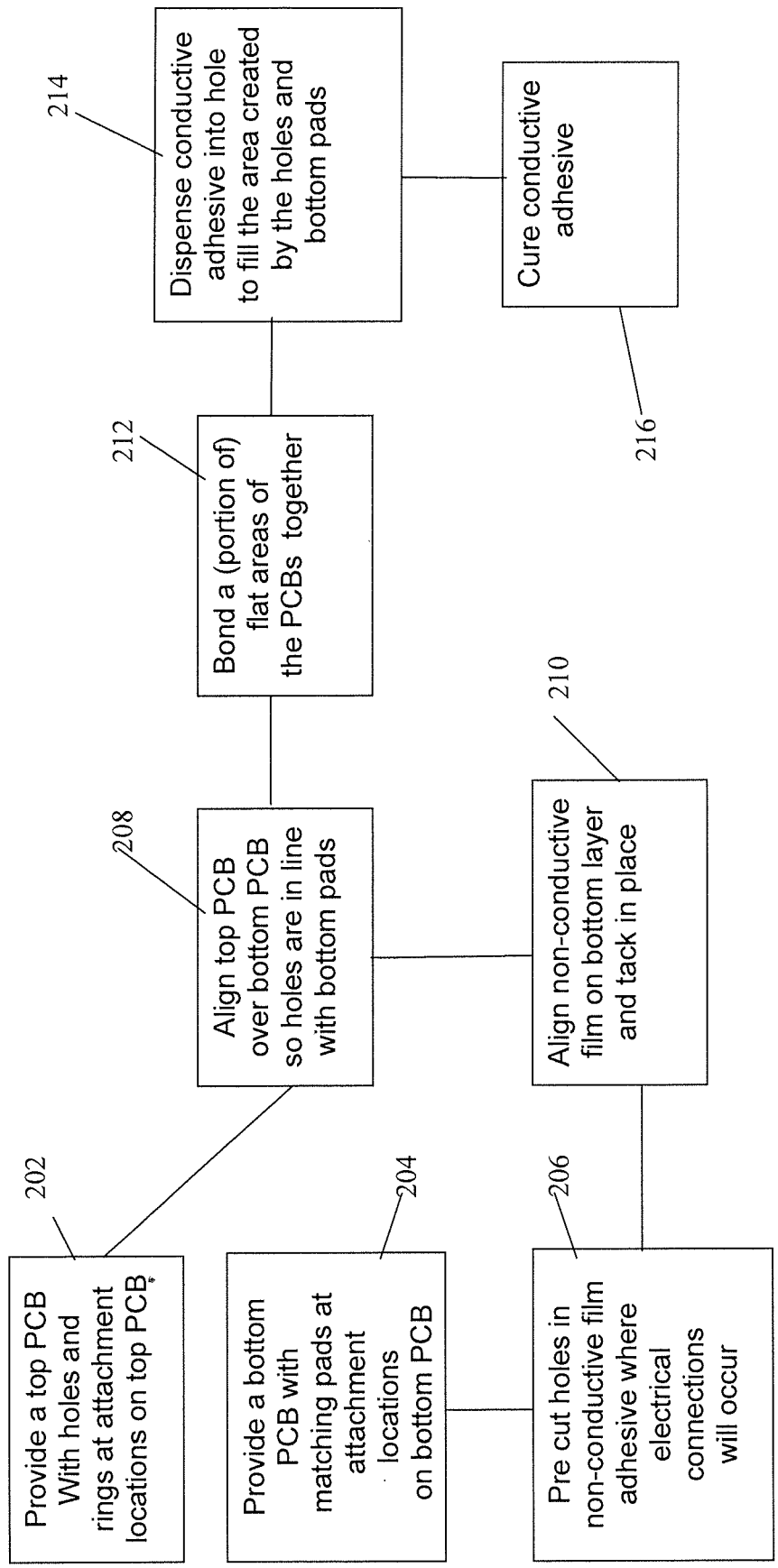
FIG. 2 shows an exemplary process flow for interconnection of two or more PCBs with non-conductive film, according to some embodiments of the present invention.

FIG. 2 shows an exemplary process flow for interconnection of two or more PCBs with non-conductive film, according to some embodiments of the present invention. As shown in block 202, a top PCB is provided (e.g., designed and fabricated) with holes and (annular) rings at the attachment locations. Similarly, in block 204, a bottom PCB is provided (e.g., designed and fabricated) with pads matching the location of the pads on the top PCB at the attachment locations. Clearance for the pads in the non-conductive adhesive film is provided by pre-cutting matching holes in the non-conductive adhesive film where the electrical connections (of the two PCBs) will occur, as shown in block 206. In block 208, the top PCB is aligned with the bottom PCB so that the holes in the top PCB are in line (aligned) with the corresponding pads on the bottom PCB. The non-conductive adhesive film is aligned on the bottom PCB and tacked in place, as shown in block 210. A portion of the flat areas of the two PCBs are then bond together with, for example, heat and pressure using the non-conductive film for mechanical interconnect, as shown in block 212.

In block 214, a conductive adhesive is dispensed into the holes to fill the area created by the holes, the pads and the non-conductive film, and on top of the pads. The conductive adhesive is then cured by, for example, heat in block 216.

Figure 3:
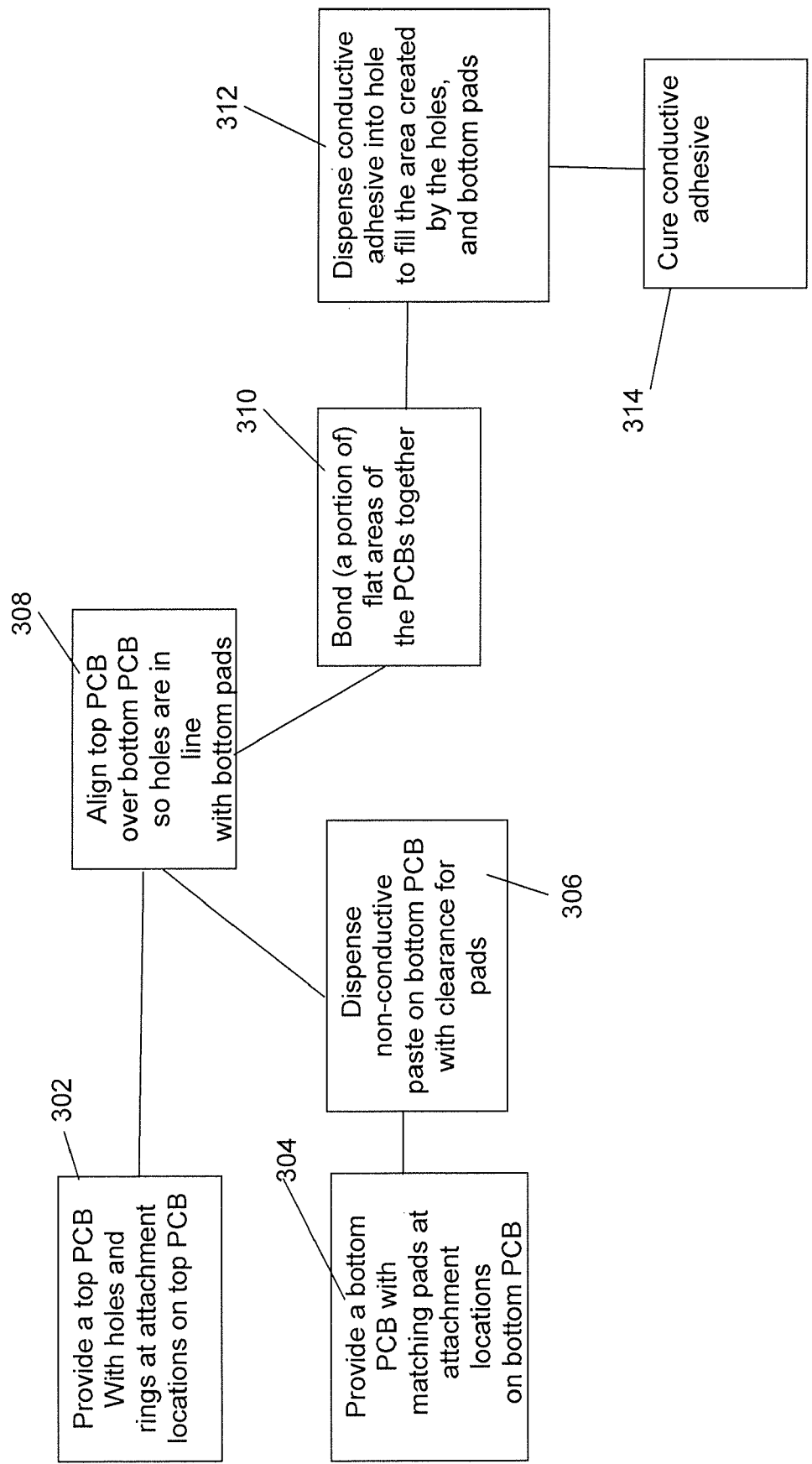
FIG. 3 shows an exemplary process flow for interconnection of two or more PCBs with non-conductive paste, according to some embodiments of the present invention.

FIG. 3 shows an exemplary process flow for interconnection of two or more PCBs with non-conductive paste, according to some embodiments of the present invention. As depicted in block 302, a top PCB is provided (e.g., designed and fabricated) with holes and (annular) rings at the attachment locations. Similarly, in block 304, a bottom PCB is provided (e.g., designed and fabricated) with electrical pads matching the location of the pads on the top PCB at the attachment locations. Here, the non-conductive paste is dispensed on the bottom PCB with clearance for the pads on the bottom PCB, as shown in block 306. In block 308, the top PCB is aligned over the bottom PCB so that the hole in the top PCB are in line with the pads on the bottom PCB. A portion of the flat areas of the two PCBs are then bond together with, for example, heat and pressure to cure the non-conductive paste for mechanical interconnect, as shown in block 310. In block 312, a conductive adhesive is dispensed into the holes to fill the area created by the holes, the pads and the non-conductive paste, on top of the pads. The conductive adhesive is then cured by, for example, heat in block 314.

FIG. 4 shows an exemplary process flow for interconnection of two or more PCBs with fusion bond, according to some embodiments of the present invention. As shown in block 402, a top PCB is provided (e.g., designed and fabricated) with holes and (annular) rings at the attachment locations. Likewise, in block 404, a bottom PCB is provided (e.g., designed and fabricated) with electrical pads matching the location of the pads on the top PCB at the attachment locations. In block 406, the top PCB is aligned over the bottom PCB so that the hole in top PCB are in line with the pads on the bottom PCB. The two PCBs are then mechanically attached together by fusion bonding a portion of the areas of bare dielectric material on the two PCBs in block 408. In block 410, a conductive adhesive is dispensed into the holes to fill the area created by the holes, the pads and the non-conductive paste, on top of the pads. The conductive adhesive is then cured by, for example, heat in block 412.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:

1. A flex printed circuit board (PCB) assembly comprising:
    a first flex PCB including a plurality of holes at electrical contact locations, each hole having a conductive ring on both sides of the first flex PCB;
    a second flex PCB including a plurality of electrical pads corresponding to the holes at the electrical contact locations of the first flex PCB, wherein the pads are larger than the holes, and wherein each hole has a particular size and a particular location to enable visual alignment of the holes in the first flex PCB with the pads of the second flex PCB, before the first flex PCB and the second flex PCB are assembled together;
    a non-conductive adhesive material between and in contact with the first flex PCB and the second flex PCB to bond the first and second flex PCBs together, the non-conductive adhesive material including a clearance for each of the electrical pads, wherein each clearance is substantially equal to a corresponding electrical pad and comprises a cavity in the non-conductive material; and
    a conductive adhesive dispensed in the holes and filing the space created by the holes, corresponding cavities of the non-conductive material, and the corresponding electrical pads to provide electrical contacts between the holes of the first flex PCB and the pads of the second flex PCB.

2. The flex PCB assembly of claim 1, wherein the non-conductive material is a non-conductive adhesive film and the clearances of the non-conductive material are cut holes in the adhesive film at the contact locations.

3. The flex PCB assembly of claim 1, wherein the non-conductive material is a non-conductive paste and the clearances of the non-conductive material exclude the non-conductive paste at the contact locations.

4. The flex PCB assembly of claim 1, wherein the first flex PCB includes conductive material at the holes with an annular ring shape.

5. The flex PCB assembly of claim 1, wherein the first flex PCB includes conductive material at the holes.

6. The flex PCB assembly of claim 5, wherein each of the conductive material at the holes is in an annular ring shape.

7. The flex PCB assembly of claim 5, wherein each of the conductive rings has an outer diameter substantially the same size as a diameter of the electrical pads.

8. The flex PCB assembly of claim 1, wherein each of the holes has an outer diameter larger than that of a standard via.

* * * * *